United States Patent [19]
Fogel et al.

[11] Patent Number: 5,898,991
[45] Date of Patent: May 4, 1999

[54] METHODS OF FABRICATION OF COAXIAL VIAS AND MAGNETIC DEVICES

[75] Inventors: Keith Edward Fogel, Bardonia, N.Y.; Jeffrey Curtis Hedrick, Park Ridge, N.J.; David Andrew Lewis, Carmel, N.Y.; Eva E. Simonyi, Bronx, N.Y.; Alfred Viehbeck, Fishkill, N.Y.; Stanley Joseph Whitehair, Peekskill, N.Y.

[73] Assignee: International Business Machines Corporation, Armonk, N.Y.

[21] Appl. No.: 08/783,738

[22] Filed: Jan. 16, 1997

[51] Int. Cl.$^6$ .......................................... H01F 7/06
[52] U.S. Cl. ............................................. 29/602.1
[58] Field of Search ..................... 336/200, 232; 174/260, 261, 262, 264, 265, 266; 29/825

[56] References Cited

U.S. PATENT DOCUMENTS

| | | |
|---|---|---|
| 4,543,553 | 9/1985 | Mandai et al. . |
| 4,689,594 | 8/1987 | Kawabata et al. . |
| 5,098,864 | 3/1992 | Mahulikar ................. 29/825 |
| 5,126,714 | 6/1992 | Johnson . |
| 5,251,108 | 10/1993 | Doshita . |
| 5,279,988 | 1/1994 | Saadat et al. . |
| 5,282,312 | 2/1994 | DiStefano et al. . |
| 5,300,911 | 4/1994 | Walters . |
| 5,481,436 | 1/1996 | Werther ..................... 29/825 |
| 5,541,567 | 7/1996 | Fogel et al. ................. 336/200 |

*Primary Examiner*—David A. Scherbel
*Assistant Examiner*—Benjamin M. Halpern
*Attorney, Agent, or Firm*—Daniel P. Morris

[57] ABSTRACT

Methods are described for fabricating devices having vias containing more than one electrical conductor, in particular coaxial electrical conductors. A plurality of wires are bonded to a first substrate, such as a copper wire to a copper substrate. A second substrate having through-holes with side walls covered with an electrical conductor is disposed over the first substrate so that the wires are within the through-holes and spaced apart from the side walls. The first substrate is spaced apart from the second substrate by dielectric spacers. A polymer is injected into the space between the first and second substrates to provide electrical isolation therebetween. A polymer is injected into the space in the via between the elongated conductors and the conductive sidewall to provide dielectric isolation therebetween. The second substrate has electrically conductive pattern on both sides which are electrically interconnected by the electrically conductive sidewall to form an inner coil of electrical conductors. The first substrate is patterned to form an electrical conductive pattern. A pattern of electrical conductors is formed on the dielectric material on the side of the second substrate opposite the patterned first substrate and is electrically connected therewith through the elongated conductors on the through-hole to form an outer coil of electrical conductors around the inner coil of electrical conductors to from a transformer or an inductor.

21 Claims, 7 Drawing Sheets

METHODS OF FABRICATION OF COAXIAL VIAS AND MAGNETIC DEVICES

FIELD OF THE INVENTION

The present invention is directed to methods of making electrically conductive vias in a substrate wherein the via is formed from a through-hole in the substrate having at least one solid electrically conductive pin or wire pin extending therethrough and applications thereof to magnetic devices, such as transformers and inductors.

BACKGROUND

The transformation of electrical power from AC to DC, and/or from one voltage to another is critical in the use of all electronic devices. Transformer and inductor circuits are used in the transmission of electrical power from the generating site to distribution points and from there to consumers. Most electrical devices require magnetic components to modify the electrical voltages especially those devices containing integrated circuits and logic elements.

As the sizes of devices continue to shrink, to improve speed, reduce weight and product size, the power transformer has become a limitation to this continual reduction. The largest single component in products such as computers has become the transformer. The most commonly used transformer consists of copper wires hand wound around a magnetic material such as iron or ferrite core. Due to the limitations of today's manufacturing methods, heat dissipation requirements and electrical efficiency, the size of magnetic components cannot be significantly further reduced.

A number of alternative magnetic structures have been developed over the last few years, with a number of deficiencies, most notably the prospect of the further reduction in size and improved efficiency. Examples of these include U.S. Pat. Nos. 4,543,553, 4,689,594, 5,126,714 and 5,279,988.

U.S. Pat. No. 4,543,553 describes a magnetic inductor structure. The coil is achieved by passing current through a series of successive magnetic layers, using one conductor per via to create the coil.

U.S. Pat. No. 4,689,594 defines a structure which operates as an inductor, the simplest type of magnetic device. In this structure, magnetic material is utilized with through holes. It is important to note that once again, only one conductive element is utilized per through hole.

Another magnetic structure is described in U.S. Pat. No. 5,126,714 in which the transformer is formed from two layers of magnetic material with magnetic posts connecting the two layers. The coil is formed on a planar sheet using printed circuit technology. Once assembled, the posts extend through the structure, making the magnetic elements. The through vias used are for electrical connection to the external contacts and are single conductor elements. U.S. Pat. No. 5,279,988 also utilizes single conductor vias for interconnection through the multilayer magnetic structure.

U.S. Pat. No. 5,300,911, "Monolithic Magnetic Device with Printed Circuit Interconnections" describes a magnetic device in which a slab of magnetic material which contains an array of through holes that permit the connection of electrical circuits on each side, forming a "coil". These through connections are formed by using electroplating technology to metallize the through hole to form two concentric, electrically isolated, conductive elements which forms the connection to each of two separate wiring structures on each side of the magnetic element thus forming a secondary and primary winding layer. The difficulties with this approach are the limitation in the wiring density and the performance due to the technologies required to make two concentric electrically conductive elements which are electrically isolated by electroplating techniques.

OBJECTS

An object of the present invention is to provide improved methods for fabricating electrically conductive vias.

It is another object of the present invention to provide improved methods for fabricating magnetic devices using the improved electrically conductive via.

It is an object of the present invention to provide a method of fabricating an electrically conductive via having a solid elongated conductor disposed within a through-hole in a substrate.

It is another object of the present invention to provide a method of fabricating a magnetic structure wherein the through-hole has an electrically conductive material disposed on a sidewall thereof for forming an innerwinding and wherein the elongated conductor is forming another winding.

It is another object of the present invention to provide a low cost method by using dielectric spacers to prevent electrical shorting of the first and second coils.

SUMMARY OF THE INVENTION

A broad aspect of the present invention are methods for making electrically conductive vias having the steps of:

providing a first substrate having at least one through-hole; providing a second substrate having a surface from which one elongated electrical connectors projects therefrom; disposing the first substrate in relation to the second substrate so that the electrical conductors are disposed in the through-holes; and, disposing in the through-hole a dielectric material.

A more particular aspect of the present invention are methods of fabricating magnetic devices such as transformers and conductors wherein the through-hole has an electrically conductive material disposed thereon and is used to form an interior coil of electrical conductors and wherein the elongated electrical conductors are used to form an outer coil of electrical conductors.

BRIEF DESCRIPTION OF THE DRAWINGS

Further objects, features, and advantages of the present invention will become apparent from a consideration of the following detailed description of the invention when read in conjunction with the drawing FIGs., in which.

DETAILED DESCRIPTION

To overcome the deficiencies of the prior art, we have invented a structure in which one or more concentric conductive elements are replaced by one or more solid electrically conductive "pins" or "posts" to provide electrical connection between the circuits on each side of the magnetic substrate. This also results in improved power efficiency of the transforming device since losses due to capacitive coupling between the electrically isolated primary and secondary windings and between the windings and the ferrite core are reduced.

An added advantage of this structure is that in addition to two windings (primary and secondary), additional windings (tertiary, etc) can be added to the same structure by the utilization of additional pins within the same through hole. This ability to form multiple connections through each perforation in a magnetic substrate permits the fabrication of flat, highly conductive winding having excellent electric properties and permits the integration of multiple magnetic components onto the same magnetic core. The integration feature is an added advantage in allowing further reduction in weight, size, and profile of magnetic components. Furthermore, this would permit the design of new and improved magnetics and more energy efficiency power supplies. Planar integrated magnetics would also allow fully automated direct surface mount attach to printed circuit boards due to their flat profiles which translates into reduced assembly costs to manufacture.

The conductor winding patterns can be fabricated using conventional printed circuit board technology such as additive or semi-additive metal plating and photolithography technologies. Alternatively, a subtractive metal etch technology can be utilized. The use of printed circuit board fabrication technology in the manufacture of integrated planar magnetics results in excellent quality control and performance reproducibility which allows loser tolerances in the design of electronic circuits and thus benefits in reduced circuit costs.

The present invention will be described for use in a magnetic device, however, it is not limited thereto.

The fabrication of low profile transformers will allow devices in which they are utilized, such as power inverters for flat panel thin film transistor displays and DC-DC converters to become thinner. Most of these devices are currently limited by the size of the transformer necessary. Integrated planar magnetics will overcome the size limitations of current power transformers. The primary challenge lies in the fabrication of such devices.

We have overcome the previous difficulties in the fabrication of these structures by the use of one or more solid through pins, either as part of a coaxial via or as stand-alone electrical through connections.

Figure 1:
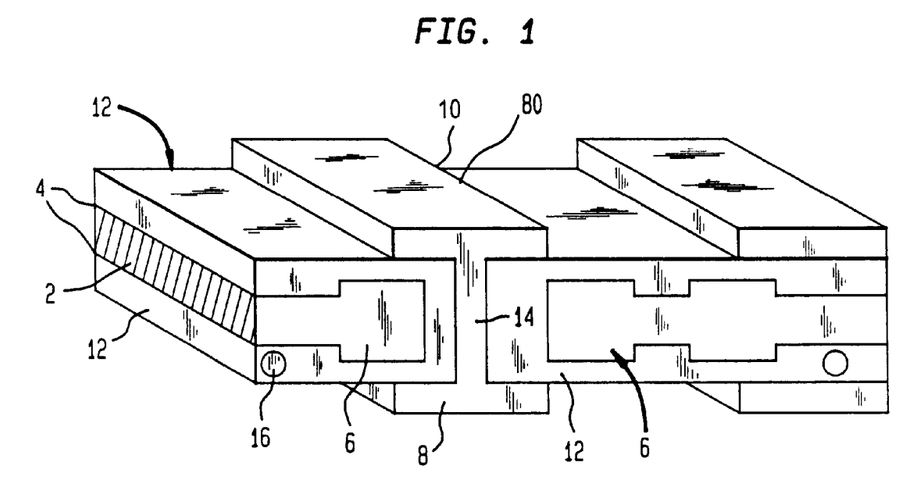
FIG. 1 shows a perspective with a front cross-sectional view of a structure according to the present invention having a low profile transformer utilizing a solid pin as part of the coaxial via for electrical connection of the outer windings.

FIG. 1 shows an integrated planar magnetic transformer utilizing the solid pin coaxial structure, where 2 is a ferrite substrate having a thickness typically between, but not limited to 0.030" and 0.050" with perforations or holes of circular cross-section between, but not limited to 0.030" and 0.050" diameter. This is completely coated with a thin dielectric layer 4 (including inside the holes) to a thickness of about 0.004" which is utilized to electrically isolate the first copper windings from the ferrite core and thereby prevent shorting of the electrical windings to the core. This layer can be made up of a number of materials, including parylene, photosensitive epoxy resin (eg. envibar), cyanate or epoxy resins. First electrical windings, 6 can act as either primary or secondary windings for the transformer structure, depending on the application. Plated through hole technology is utilized to electrically connect the electrical wiring level on the upper and lower surface of the ferrite substrate 2. This winding is electrically isolated from the second winding 8 and 10 by a dielectric layer 12, which can be any polymeric or filled polymeric material, where the filling material can provide thermal conductivity or rheological benefits, reduced coefficient of thermal expansion. The top winding, 10 is electrically connected to the bottom winding 8 by a solid pin 14 which is preferably constructed of predominantly copper, although gold, chrome and platinum can be present either in small amounts dispersed throughout the pin or as layers. Spacers, 16 were utilized in the processing sequence to maintain preferred separation of the winding layers during fabrication and remain part of the final structure, although in the preferred embodiment they are not actively utilized during normal operation of the transformer. This structure can then be encapsulated in a suitable resin, e.g. an epoxy, and with suitable surface contacts, be surface mounted directly onto an electronic circuit board with other electrical components.

The structure shown in FIG. 1 shows a perspective view of a structure according to the present invention with a cross-section through via in the structure. The fabrication of the structure of FIG. 1 is shown in detail in FIGS. 2–4.

Figure 2:
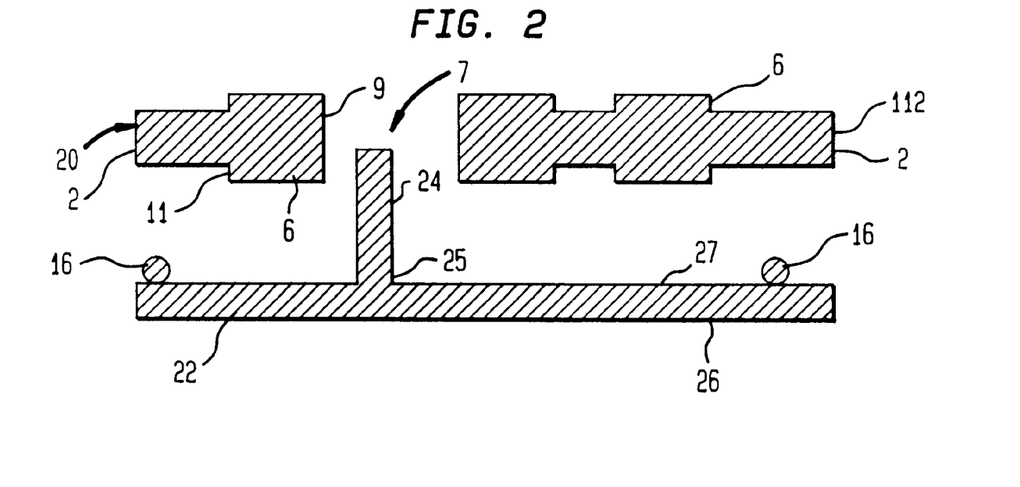
FIGS. 2 to 4 schematically shows a method according to the present invention to fabricate the structure of FIG. 1.

Referring to FIG. 2, structure 20 has first windings 6 with through holes having metal 9 plated about the side wall 11, corresponding to elements 2–6 from FIG. 1 is placed onto structure 22. Structure 22 consists of a plate, preferably copper, on which the top surface is coated with about 0.0005" of gold, with pins or wires 24 attached in positions corresponding to the holes 7 in the structure 20. These pins are attached using the methods described in U.S. patent application Ser. No. 08/224,383 filed on Apr. 7, 1994 to Beaman et al. and U.S. patent application Ser. No. 07/963,346 filed on Oct. 19, 1992, the teachings of which are incorporated herein by reference.

Figure 11:
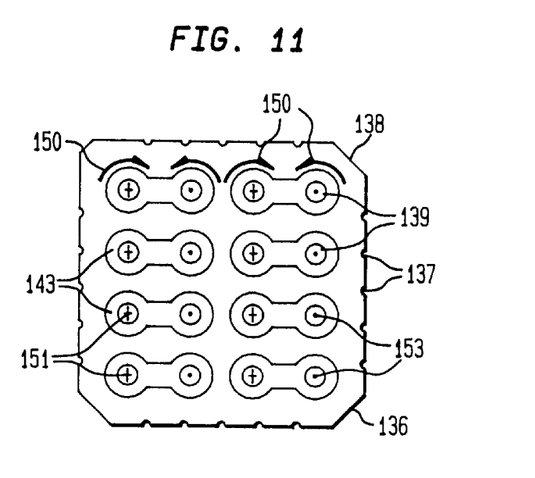
Figure 12:
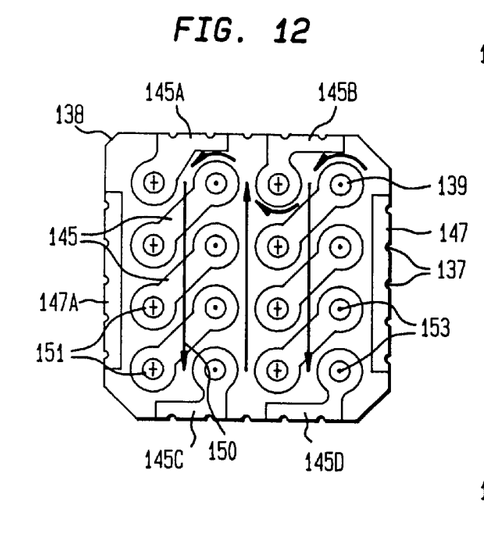
FIGS. 12 and 13 are plan views of the bottom and top side, respectively, of the structure of FIG. 1 having a second pattern of conductive material on each side, electrically converted by the solid pin to form a second electrically conductive coil surrounding the first electrically conductive coil.
Figure 14:
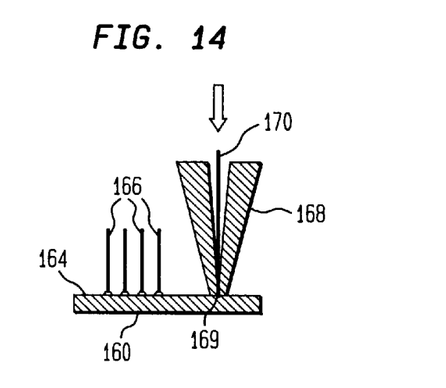
FIGS. 14, 15 and 16 schematically show a method for forming the pin structure of FIG. 1.
Figure 15:
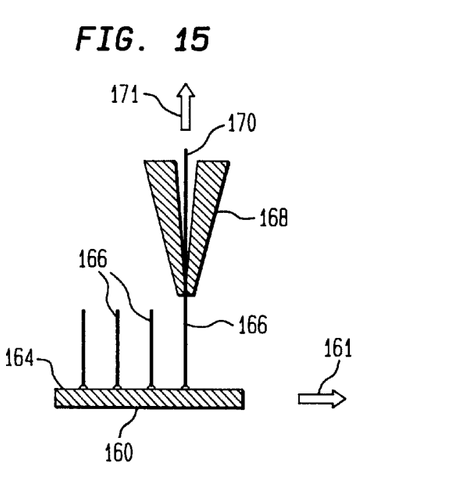
Figure 16:
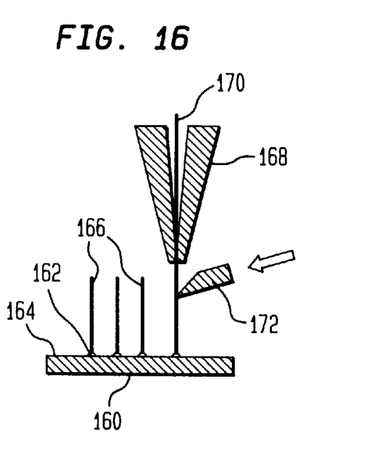

Referring to FIGS. 14, 15 and 16 the fabrication process for substrate 22 of FIG. 2 with elongated conductors 24 thereon starts with a sacrificial substrate 160, which is preferably copper, copper/Invar/copper of copper or copper/molybdenum copper. Materials other than copper can be used such as aluminum, hard plastic or steel. The top surface 164 of substrate 160 is sputtered or plated with soft gold or Ni/Au to provide a suitable surface for thermosonic ball bonding. Other bonding techniques can be used such as thermal compression bonding ultrasonic bonding, laser bonding and the like. A commonly used automatic wire bonder is modified to ball bond gold, gold alloy, copper, copper alloy, aluminum, nickel or palladium wires 166 to the substrate surface 164 as shown in FIG. 11. The wire preferably has a diameter of 0.001 to 0.005 inches. If a metal other than Au is used, a thin passivation metal such as Au, Cr, Co, Ni or Pd can be coated over the wire by means of electroplating, or electrolyze plating, sputtering, e-beam evaporation or any other coating techniques known in the industry. Structure 168 of FIG. 14 is the ball bonding head which has a wire 170 being fed from a reservoir of wire as in a conventional wire bonding apparatus. FIG. 14 shows the ball bond head 168 in contact at location 169 with surface 164 of substrate 160.

FIG. 15 shows the ball bonding head 168 withdrawn in the direction indicated by arrow 171 from the surface 164 and the wire 170 drawn out to leave disposed on the surface 164 wire 166. In the preferred embodiment, the bond head 168 is stationary and the substrate 160 is advanced as indicated by arrow 161. The bond wire is positioned preferably perpendicular to surface 164 and then mechanically severed by knife edge 172 as shown in FIG. 16. The knife edge 172 is actuated, the wire 170 is clamped and the bond head 168 is raised. When the wire 170 is severed there is left on the surface 164 of substrate 160 a flying lead 166 which is bonded to surface 164 at one end with a ball bond 162 and the other end projects outwardly away from the surface. The ball bond is a flattened hemispherical like protuberance bonded to surface 164. A ball can be formed on the end of the wire 166 which is not bonded to surface 164 using a laser or electrical discharge to melt the end of the wire. Techniques for this are commonly known in the art. The wire 170 is severed to leave wire 166 disposed on surface 164 of substrate 160. The wire bond head 168 is retracted upwardly. The wire bond head 168 has a mechanism to grip and release wire 170 so that wire 170 can be tensioned against the shear blade to sever the wire.

Spacer balls 16 are used to ensure that the electrical windings on 20 are sufficiently far from the plates of structure 22. These spacers are preferably made of any nonelectrically conducting material to prevent the possibility of electrical shorts either between the windings 6 of the same circuit or the second set of windings. The spacers can also be any shape, including spherical, cylindrical, etc. The spacer height is preferably 0.003–0.010" high, depending on the thickness of the electrical windings 6 and the electrical breakdown voltage required for the device. Pin or wire 6 when inserted into via 7 forms with electrical conductor 11 about sidewall 11 a coaxial conductor.

Figure 3:
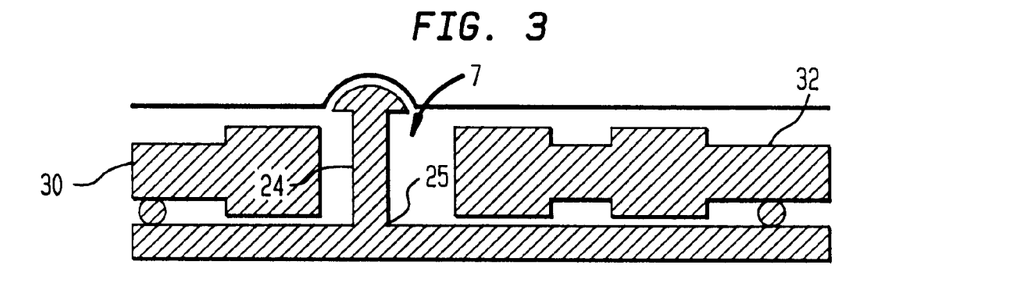

Structure 30 in FIG. 3 is the result of assembling the components in FIG. 2. Preferably a polymeric resin is then slowly poured into a mold containing structure 30 in such a manner as to prevent bubble and void formation and ensuring that resin was able to reach into the coaxial vias formed between the holes in structure 20 and the pins 24. The resin is preferably a highly filled epoxy resin that has a relatively low coefficient of thermal expansion which will limit the level of residual stress that the final structure will be exposed to. The ferrite, 2, typically used is extremely brittle and subject to fatigue and stress related fracture. The resin is then cured according to manufacturers instructions.

The plate 26 on the bottom surface is then removed preferably by etching, grinding, or other commonly known methods and as described in the U.S. applications incorporated by reference hereinabove to leave a planar surface on one side. The excess polymeric resin 32 on the top surface is then planarized using polishing commonly known methods. If a suitable resin was used, other planarizing methods could also be employed, including plasma or solvent etch. The electrically conducting vias 15 are then acid (what acid) etched to remove debris from the planarizing operations and oxides of copper.

The outside windings 10 and 8 respectively, on the top and bottom surface, connected through the pins 14 can be created in a number of ways using methods known in the art of printed circuit board manufacturing, including (a) blanket metal deposition on both surfaces, followed by selective etching; (b) metal plate-up through a mask; or (iii) as a result of a defined seed structure.

Figure 4:
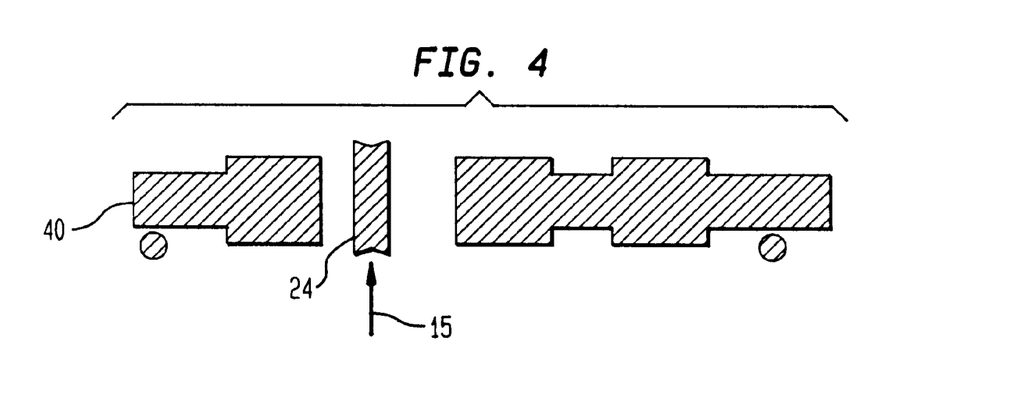
Figure 5:
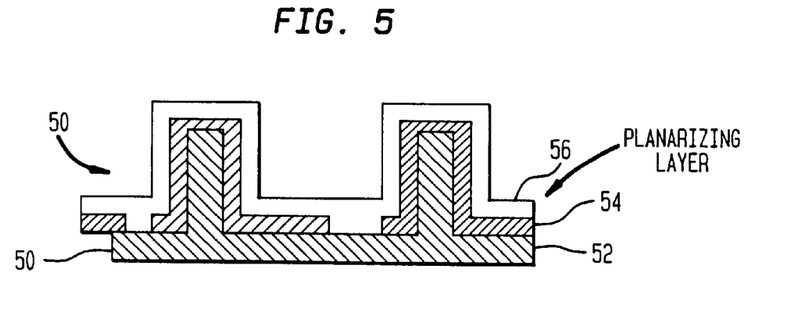
FIGS. 5 and 6 show a pin structure for use in the structure of FIG. 1 similar to that of FIG. 2 with an electrically conductive central solid pin surrounded by an electrical conductor.
Figure 6:
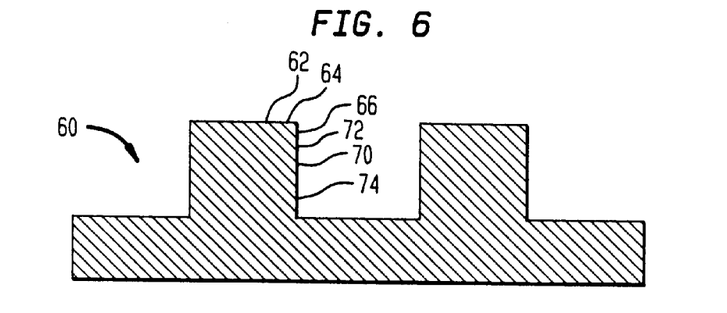

In cases where it is desirable to have more than two pin or wire conductors per hole, an alternative transformer structure utilizes multiple concentric conductor layers in the form of a multiconductor pin 50 in FIG. 5, to replace the single pin structure 22. The remaining process steps are similar, with the exception that a number of layers of outside windings are sequentially formed. The multiconductor pin is formed by first forming structure 22, in FIG. 2. A conformal dielectric layer 52 is then formed over the top surface, including the pins. This is followed by the application of a seed layer and electro-plating to the desired thickness of metal over the entire structure, the application of an electrophoreticically deposited photoresist (such as Shipley Eagle) to define the pattern and etching to produce a final wiring structure 54. Additional conductors can be formed by applying a thin planarizing layer 56 and repeating the metal deposition and etching steps as often as desired to form a structure such as 60, in FIG. 6 where in 62, 64 and 66 are electrical conductors and 70, 72 and 74 are dielectric layers between the metal layers. The structure 20 of FIG. 4 is then placed over the multiconductor pins 50 or 60, followed by dielectric filling. The dielectric layer is selectively etched to reveal the outside metal conductor of the outermost conductor layer of the pin extending above the surface of the dielectric. Electrically conducting material is applied over the entire surfaces and patterned to form circuits, preferably using a commonly known subtractive etch process which simultaneously removes the outer layer of electrically conducting material from the exposed region of the pin to allow for connection to the next layer of metal in the pin structure. This process is repeated until all of the conductors in the pin have been connected to the appropriate levels of wiring.

Figure 7:
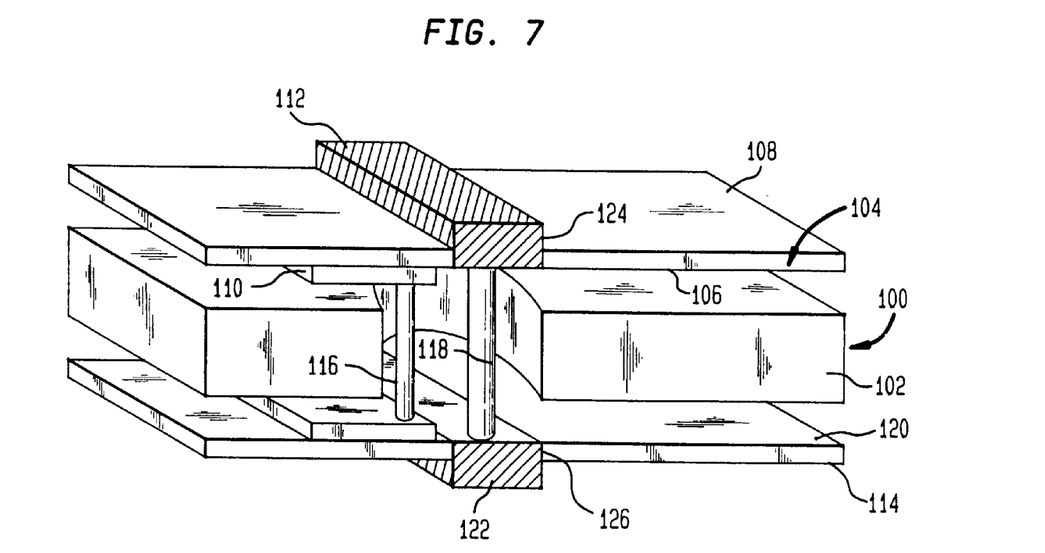
FIG. 7 shows a via for use in the structure of FIG. 1 having two solid electrically conductive pins.

Referring to FIG. 7, an alternative transformer structure 100 utilizes two solid electrically isolated conductors 116 and 118 to connect each of the upper and lower windings for each of the primary and secondary windings. In this structure, the core 102 uses predrilled holes, but does not need conductive windings attached to it. It may still utilize a thin conformal coating to provide insulation between the conductive windings and the core, if desired. An upper substrate 104 is fabricated from polyimide in a TAB like process, which is known in the art, or from prepreg utilizing conventional circuit board plating technologies, also known to the art. This substrate contains an inner surface 106 and an outer surface 108 on which conductive lines are formed to ultimately generate the inner 110 and outer 112 windings. On the lower side of the structure 100 is another substrate 114, similar in structure and components to 104, but with a different circuitized pattern, such that when these two substrates 104 and 114 are joined utilizing pins 116 and 118, two electrically isolated coils are formed surrounding the ferrite core 102, making the transformer. Pins 116 and 118 can be connected to one of the substrates 104 or 114 by the bonding technique of FIGS. 14–16 and can be bonded to the conductors of the other substrate by thermo compression bonding, solder bonding, ultrasonic bonding and the like. These components are mechanically locked in place via a nonconductive dielectric material 120, such as epoxy resin, cyanate resin, polyurethane, etc which are filled or unfilled to provide a coefficient of thermal expansion match to the ferrite or provide a greater thermally conductive path to allow heat dissipation from the substrate. The outer windings 112 and 122 are connected to the solid pin 118 using conductive vias 124 and 126 through the upper and lower substrates 104 and 114. These vias can be of any design and material selection, including plated metal, plated through hole, metal paste, solder of conductive polymer. The pins 116 and 118 can be coated with a dielectric material to ensure electrical isolation in case of misalignment through the hole and provide an additional insulation layer in addition to the dielectric material 120. Electrical contact between the pins themselves and upper and lower substrates can be made using transient liquid phase bonding, thermal compression bonding, solder or conducting polymers. The primary limitation as to the type of material is the efficiency of the final device and the voltage drop caused by the region of higher conductivity compared with the copper wiring used throughout the remainder of the device.

Additional pins can be added to the structure 100 using through hole technology to additional substrate layers above the upper substrate 104 and below the lower substrate 114.

Figure 8:
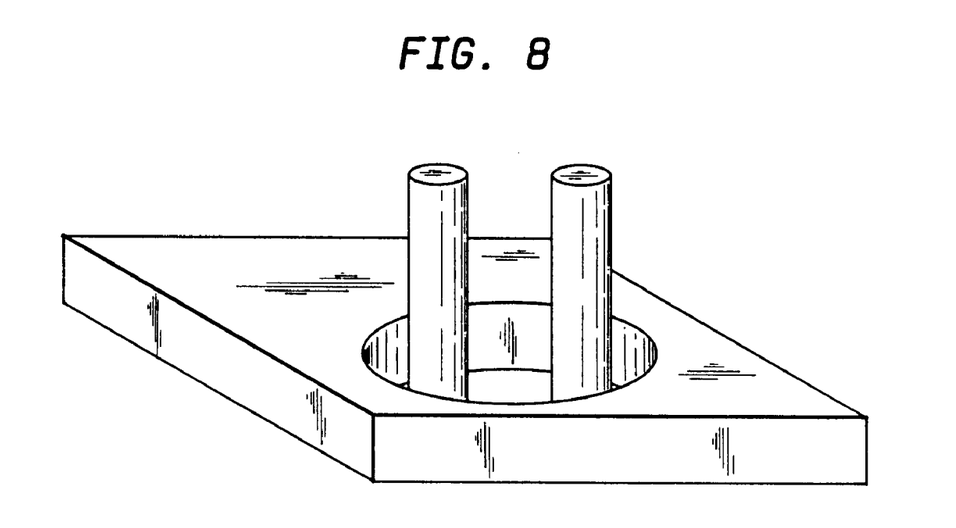
FIG. 8 shows a substrate with a single circular through-hole having two solid conductors extending therethrough.
Figure 9:
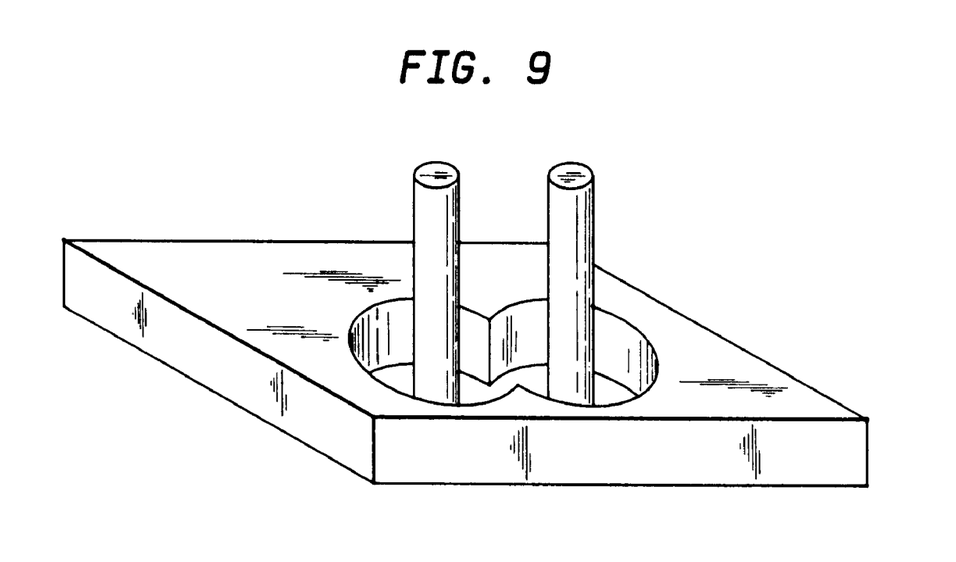
FIG. 9 shows a substrate with a figure-eight shaped through-hole having two solid conductors extending therethrough.
Figure 10:
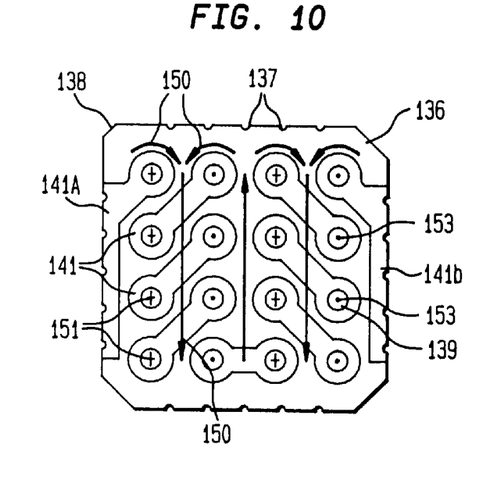
FIGS. 10 and 11 are plan views of the bottom and top side, respectively, of a plate of material with a first pattern of conductive material on each side electrically connected by electrically conductive material on the through-hole sidewall to form a first electrically conductive coil.

The holes in the materials 102 and 2 are typically of circular cross-section as shown as 202 in FIG. 8 with one or more solid conductors passing through as in FIG. 9, but can also be formed by two cylinders drilled close together to form a "Figure of eight", shown in FIG. 10. In this orientation, one pin is located in each loop of the figure, as shown in FIG. 11. This allow for larger diameter pins to be utilized, while minimizing the size of the through holes. to provide the greatest density possible and therefore the smallest device size possible. Additional "loops" can be added to the via structure in FIG. 10 to allow for additional pins to pass through a single "hole". Other shapes of through holes can be utilized as desired with the aim of increasing the size of the solid pin compared to the size of the hole and minimize wasted space, thereby maximizing the efficiency of the device.

The size of the solid conductor is important to ensure that the maximum current is not limited in this structure. The correctly sized pin for a particular power application can be formed either by using the correct sized pin in the wire bonding tool or other which forms the structure 22 or by plating-up a structure using the size pins allowed by the equipment utilized. Plating can be a problem if the structure such as 100 is to be used, in which the coils have already been created at the correct dimensions.

To overcome these problems, the electrical conductors are protected by a thin dielectric layer which is ablated during the pin attachment, but only at the point of attachment. Suitable materials for the dielectric layers include poly (methyl methacrylate) and poly(propylene oxide) which unzip under heating to form monomer and leave no contamination and some poly(imides) which also allow an electrical connection to made with little or no degradation in the electrical performance due to contamination of the joint. After the electrical connection has been made, the pins can be enlarged using electrolyze plating, or electroplating, using the preformed coils of the substrate to supply voltage and current.

A multiple element magnetic device which can be configured as a transformer with different turns ratios or arranged as multiple transformers is shown in FIGS. 10, 11, 12 and 13. The multiple element device has a single plate of magnetic flux permeable, high electrical resistance material 136, such as ferrite, conforming to the outline of a ceramic leadless chip carrier having dimensions 0.35 inches by 0.35 inches by 0.1 inches, for example, and a plurality of indentations 137 about the perimeter to provide surface solder connection to a printed circuit board. The leadless chip carrier outline has an index corner 138 for orientation purposes. Ceramic leadless chip carriers come in a variety of sizes and different sizes can be used depending on the number of elements and the power capability desired. A plurality of single turn primary, single turn secondary, transformer elements are located on the ferrite plate, with sixteen elements shown in the embodiment of FIG. 12. As described in connection with FIG. 1, each of the transformer elements shown in FIG. 12 includes a hole 139, extending through the ferrite plate. A coating of electrically conductive material, such as copper, is plated on the bottom and top of the plate with the pattern 141 and 143 shown in FIGS. 10 and 11, respectively, using printed circuit technology. The pattern on the top of the plate 143 surrounds each of the holes and together with pattern on the bottom of the plate and plating on the interior walls of the holes connects the sixteen elements in series. The pattern on the bottom of the plate 141 provides a conductive pattern, around each of the holes and extends. The conductive pattern to the edge of the chip to form interconnect regions 141A and 141B for the first and last element in the series connection of the elements. The plates holes 139 serve as vias connecting plated areas surrounding the holes at the top and bottom of the plate. The first layer of conductive plating in the hole provides the primary winding of the transformer element. A layer of electrically insulating material, such as Parylene C thermoplastic polymer, is deposited on the plated conductive material including the vias, as was discussed in connection with FIG. 11.

Figure 13:
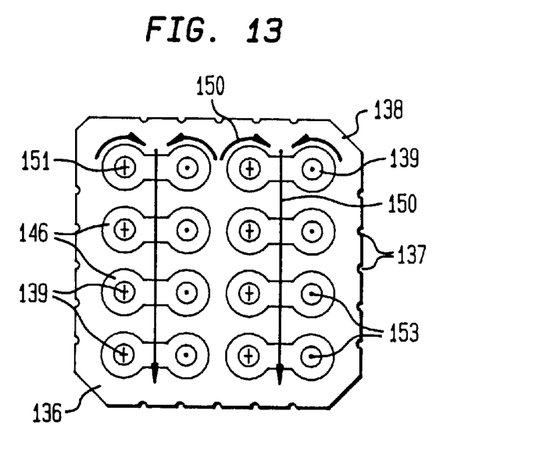

As described herein above, a second layer of electrical current conductive material, such as copper is plated on the bottom and top of the insulating material, with the second layer of plating in the vias forming the transformer element secondary as shown in FIGS. 13 and 14. The circles containing the arrow heads 151 and tails 153 are the solid pins or wires 24 of FIG. 2. Note the location of the indexing corner 38 in determining the relative orientation of FIGS. 13 and 14. The pattern of conductive material on the bottom of the plate 145 cover pins and together with the pattern 146 on the top of the plate providing two groups of eight series connected elements. The pattern on the bottom of the plate brings out four termination regions 145A, 145B, 145C, and 145D to the edge of the plate. The termination regions are connected to the first and last element of the first eight series connected elements and the first and last element of the second group of eight series connected elements. The four locations 145A, 145B, 145C, and 145D at the edge of the plate are not aligned with the interconnect regions 141A and 141B of the first conductive layer and the four locations form a termination region for connecting, by means of solder, the leadless chip carrier shaped plate to a circuit card. Termination regions 147A and 147B are provided, which are aligned with the interconnect regions 141A and 141B of the first layer of conductive material. The region can be connected using solder on the edge of the ferrite.

The flux pattern in the permeable material can be controlled by the placement and interconnection of the transformer elements. The pattern shown, for example, between terminals 145A and 145C forms a coil similar to a conventional wire wound transformer. The lines of flux created by current flow in individual transformer elements can reinforce one another to enhance flux density. Arrows 150 indicate flux direction based on the direction of assumed current flow. Symbols 151 and 153 represent arrow heads and arrow tails, respectively, which indicate the direction of current flow, with arrow heads 151 indicating current flow out of the plane of the paper and arrow tails 153 indicating current flow into the plane of the paper.

When more of the elements are accessible external to the device, connections made on the circuit card, to which the magnetic device is surface mounted, can be used to achieve many turn ratio combinations depending on the series-parallel combinations of the elements. For example, by connecting N elements' primaries in series and N elements secondaries' in parallel, a transformer with an N to 1 ratio will be provided.

While the magnetic device has been described with the elements' primaries interconnected on the first copper layer and the elements' secondaries interconnected on the second copper layer, with some of the transformers interconnections provided by the next higher assembly through the power supplies circuit card, the primaries can alternatively serve as secondaries and the secondaries serve as primaries, to achieve additional turns ratio combinations. This allows the same group of multiple element transformers in a magnetic device to provide different turn ratio combinations as selected by the circuit card traces. More than two single turn windings can be provided in the holes or on the edges by adding another insulating layer followed by another layer of conductive plating. The hole size will have to be enlarged to accommodate additional windings. The connections of the magnetic device to the next higher assembly can be accomplished using the surface mounting techniques described or by other means including wire bond methods or discrete soldered wires to any surface, including the top planar surface. Termination regions can be provided at the top or bottom and distributed over the top and bottom surfaces.

Figure 18:
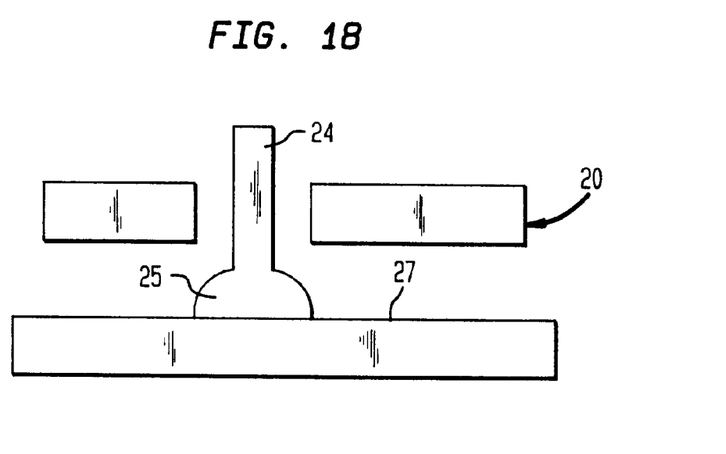
FIG. 18 shows a wire ball bonded to a substrate.
Figure 19:
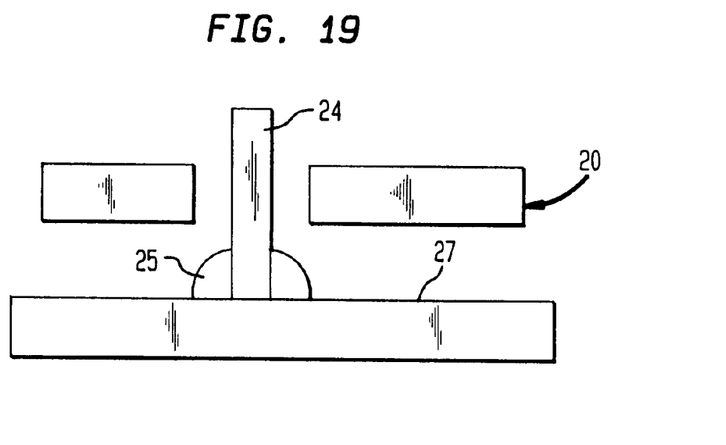
FIG. 19 shows a wire solder bonded to a substrate.
Figure 20:
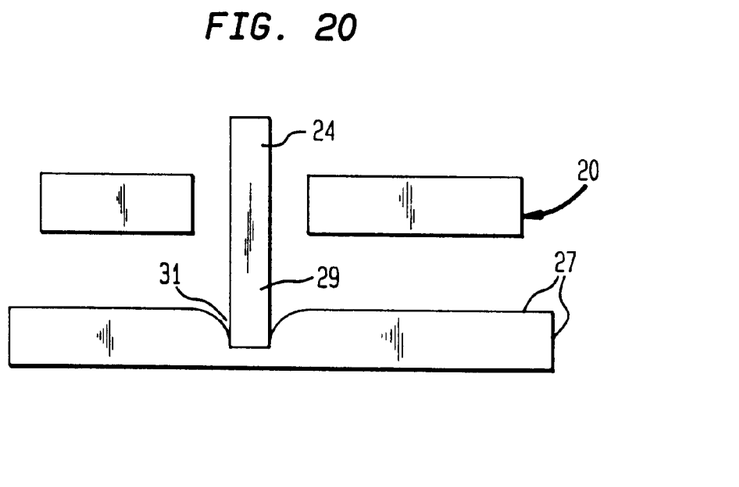
FIG. 20 shows a wire embedded in an electrical conductor on a substrate.

FIGS. 18, 19 and 20 show enlarged views of the bonding of end 25 of elongated conductor 24 to substrates 20 disposed over surface 27 with elongated conductor 24 inserted into through-hole 7 as shown in FIG. 2. FIG. 18 shows elongated conductor 24 which can be a wire bonded to surface 27 so that there is a protuberance 25 the end of the wire 24 bonded to surface 27. Protuberance 25 can be a protuberance formed by wire bonding as described hereinabove, the shape being referred to as a ball bond. The protuberance 25 of FIG. 18 can also be a protuberance formed by ultrasonic bonding. In FIG. 19 elongated conductor 24 is bonded to surface 27 using an electrically conductive adhesive material 25 such as solder which forms a protuberance at the end bonded to surface 27. In FIG. 20 elongated conductor 24 shooting elongated conductor 24 such as by using a nail gun embeds end 29 of elongated conductor 24 into surface 27 wherein there is a dimpling 31 in the surface 27 above the periphery of end 29.

The following are examples of applications of the structure according to the present invention.

A coaxial via in which the central electrical conductor is formed from a paste or solder.

A structure in which two or more conductors are surrounded by another electrical conductor and all conductors are electrically isolated from each other, if desired.

A structure in which two or more electrical interconnections between electrically conductive elements are made using the same through hole in which the conductive elements are electrically isolated where connection is made to one or more electrically conductive circuits on the outside of the structure;

where connection is made to one or more electrically conductive circuits on the inside of a structure.

A structure with magnetic components (comprising a thin layer, a feature or a block) with a hole in which there are more than one electrically separate conductive path and at least one solid conductor connecting with electrical wiring or patterns on two surfaces.

A structure which acts as an inductor, similar to the transformer structure claimed above, in which a solid pin connects the wiring at the top and bottom surface to form a coil.

A single, monolithic structure in which both inductors and transformer elements are combined in a single structure.

A single, monolithic structure in which frequency chopping circuits, filters capacitors and chokes, either an individual components or integrated onto a silicon chip, are incorporated directly onto a transformer or inductor or combination element to form a complete power handling device.

A single, monolithic structure in which frequency chopping circuits, filters capacitors and chokes, either as individual components or integrated onto a silicon chip, are incorporated directly onto a transformer or inductor or combination element to form a DC/DC converter.

A power transformer structure which is sufficiently small to fit in a regularly sized electrical plug and convert the electrical voltage from the line voltage to another voltage.

Figure 17:
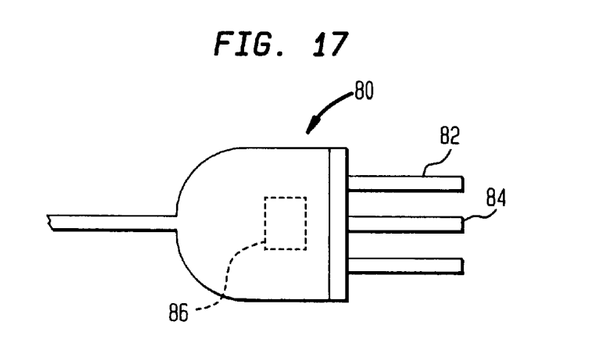
FIG. 17 shows a plug incorporating a magnetic device according to the present invention.

A power transformer structure which is sufficiently small to fit in a regularly sized electrical plug and convert the electrical voltage from AC to DC and change the voltage from the line voltage to another voltage. FIG. 17 shows plug 80 with electrically conductive elements 82 and 84 which are adapted for insertion into a socket not shown. The plug 80 contains a magnetic device 84 therein according to the present invention.

A method for the fabrication of a structure which has the capabilities for transforming electrical power.

A structure that allows the transformation of electrical power to another voltage or frequency or both in a structure such as a conventional power plug.

While the present invention has been described with respect to preferred embodiments, numerous modifications, changes, and improvements will occur to those skilled in the art without departing from the spirit and scope of the invention.

We claim:

1. In the fabricating of a magnetic device method comprising the steps of:

providing a first substrate of magnetic material having at least one through-hole;

providing a second substrate having a surface from which an elongated electrical conductor projects therefrom;

disposing said first substrate in relation to said second substrate so that said at least one elongated electrical conductor is disposed in said through-hole in forming an electrical winding of the magnetic device; and disposing in said through-hole a dielectric material.

2. A method according to claim 1, wherein said through-hole has a sidewall which has an electrically conductive material disposed thereon, said elongated electrical conductor is spaced apart from said electrically conductive material on said side wall in forming another electrical winding of the magnetic device.

3. A method according to claim 1, wherein said second substrate is formed from a material selected from the group consisting of a metal, a ferro-electric material and a dielectric material.

4. A method according to claim 1 wherein said first substrate has a first surface and a second surface, said through-hole extends between said first surface, and said second surface said first surface and said second surface have a dielectric material disposed thereon, said side wall has a dielectric material disposed thereon, further including:

disposing on said dielectric layer on said first surface and said second surface a first pattern of electrical conductors and disposing on said dielectric layer on said second surface a second pattern of electrical conductors, said first pattern of said electrical conductors is electrically interconnected by said electrical conductor on said sidewall to a part of said second pattern of electrical conductors.

5. A method for manufacturing of an inductor comprising the steps of:

providing a first substrate of magnetic material having at least one through-hole with a conductive coating;

providing a second conductive substrate having a surface from which an elongated electrical conductor projects therefrom;

disposing said first substrate in relation to said second substrate so that said at least one electrical conductor is disposed in said through-hole;

disposing in said through-hole a dielectric material; and said second substrate is disposed with respect to said second surface leaving a space therebetween and further including injecting in said space dielectric material.

6. A method according to claim 5 further includes disposing in said space dielectric bodies having a size to maintain said first substrate and said second substrate spaced apart during the injecting of dielectric material into said space.

7. A method according to claim 1 wherein said elongated electrical conductor is formed from an elongated post.

8. A method according to claim 1 wherein said elongated electrical conductor is an electrically conductive wire.

9. A method according to claim 4, further including:

disposing a dielectric coating on said first pattern of electrical conductors;

disposing a dielectric coating on said second pattern of electrical conductors;

disposing a third pattern of electrical conductors on said dielectric layer on said first pattern of electrical conductors;

said second substrate being a sheet of an electrical conductor; patterning said sheet to form a fourth pattern of electrical conductors on said dielectric layer on said second pattern of electrical conductors;

a part of said third pattern of electrical conductors being electrically interconnected by said at least one electrical conductor to a part of said fourth pattern of electrical conductors.

10. A method according to claim 1, wherein said second substrate has a first side and a second side, further including disposing on said first side a first electrically conductive pattern and disposing on said second side a second electrically conductive pattern, there being a plurality of said elongated conductors, one of said plurality of elongated electrical conductors project in a direction away from said surface of said first electrical conductive pattern;

providing a through-hole in said second substrate exposing a surface of said second electrical conductor pattern from said first side of said second substrate, one of said plurality of elongated conductors projecting therefrom.

11. A method of fabricating a magnetic device comprising the steps of:

providing a first substrate of magnetic material having at least one through-hole;

providing a second substrate having a surface from which an elongated electrical conductor projects therefrom;

disposing said first substrate in relation to said second substrate so that said at least one electrical conductor is disposed in said through-hole;

disposing in said through-hole a dielectric material; and said at least one elongated conductor comprises a central elongated conductor having an exterior surface, a dielectric layer disposed on said exterior surface and an electrically conductive layer disposed on said dielectric layer to form winding of the magnetic device.

12. A method according to claim 1 wherein said first substrate comprises a magnetic material selected from the group consisting of a metal, a ferro-electric and a dielectric.

13. A method comprising the steps of:

providing a first substrate of magnetic material having a first side and a second side having a plurality of through-holes extending from said first side to said second side, said through-holes each having a sidewall;

disposing on said sidewalls an electrically conductive material;

disposing on said first side a first pattern of electrically conductive material;

said electrically conductive material on said sidewalls electrically interconnecting said first pattern of electrically conductive material and said second pattern of electrically conductive material to form a first coil of electrical conductors for a magnetic device;

providing a second substrate of a plate of electrically conductive material;

disposing on a surface of said second substrate a plurality of elongated electrical conductors;

providing a plurality of elongated electrical conductors, each having a first end and a second end;

disposing said first ends in electrical contact with said surface so that said first ends project away from said surface;

disposing said first substrate in relation to said second substrate so that some of said plurality of elongated electrical conductors are disposed in same of said plurality of through-holes so that there is a first space between said elongated conductors and said sidewalls and so that there is a second space between said surface and said first pattern of electrically conductive material;

disposing in said first space and said second space a dielectric material;

disposing a dielectric material over said second pattern of electrically conductive material;

disposing on said dielectric material disposed over said second pattern of electrically conductive material a third pattern of electrically conductive material parts of which are electrically connected to said plurality of elongated electrical conductors;

patterning said plate to form a fourth pattern of electrically conductive material so that said third pattern and said fourth pattern are electrically interconnected by said plurality of elongated electrical conductors to form a second coil of electrical conductors of the magnetic device.

14. A method according to claim 13, further including disposing in said second space a dielectric spacer.

15. A method of fabricating a magnetic device comprising the steps of:

provided a first substrate of magnetic material having a plurality of through-holes extending therethrough;

providing a second substrate comprising:
a first side and a second side, a first a pattern of electrical conductors on said first side, a second pattern of electrical conductors on said second side, a plurality of through-holes extending from said first side to said second side exposing parts of said second pattern of electrical conductors;

providing a third substrate comprising: a third side and a fourth side, a third pattern of electrical conductors on said third side, a fourth pattern of electrical conductors on said fourth side, a plurality of through-holes extending from said third side to said fourth side exposing parts of said fourth pattern of electrical conductors;

providing a plurality of elongated electrical conductors;

disposing said first substrate between said second substrate and said third substrate with two of said plurality of elongated conductors in said through-holes in said first substrate to provide electrical connection between said first pattern and said second pattern said third pattern and said fourth pattern of electrically conductive material through said plurality of elongated electrical conductors.

16. A method according to claim 10 in which a plurality of electrically isolated connections are made.

17. A method according to claim 13 in which a plurality of electrically isolated connections are made.

18. A method according to claim 15 in which a plurality of electrically isolated connections are made.

19. A method according to claim 1, wherein said step of disposing in said through-hole a dielectric material is after said step of disposing said first substrate in relation to said second substrate.

20. A method according to claim 11 wherein said windings are serially connected together.

21. A method according to claim 11 wherein the windings are separated and form the primary and secondary windings of a transformer.

* * * * *